United States Patent [19]

Riebman

[11] Patent Number: 5,258,763
[45] Date of Patent: Nov. 2, 1993

[54] SUPERCONDUCTING NON-LINEAR DEVICE

[75] Inventor: Leon Riebman, Rydal, Pa.

[73] Assignee: AEL Defense Corp., Lansdale, Pa.

[21] Appl. No.: 900,970

[22] Filed: Jun. 18, 1992

Related U.S. Application Data

[60] Division of Ser. No. 735,132, Jul. 24, 1991, which is a continuation-in-part of Ser. No. 671,589, Mar. 19, 1991.

[51] Int. Cl.⁵ ............................................. H04B 7/00
[52] U.S. Cl. .................................... 342/350; 333/99 S; 505/1; 307/245; 307/277; 307/306
[58] Field of Search ................... 342/350; 333/99 S; 505/1, 866; 307/245, 277, 306

[56] References Cited

U.S. PATENT DOCUMENTS

| | | | |
|---|---|---|---|
| 1,992,410 | 2/1935 | Benkelman | 201/60 |
| 2,914,735 | 11/1959 | Young | 332/51 |
| 2,978,664 | 4/1961 | Walters | 338/217 |
| 3,059,196 | 10/1962 | Lentz | 338/32 |
| 3,207,921 | 9/1965 | Ahrons | 307/88.5 |
| 3,209,172 | 9/1965 | Young | 307/88.5 |
| 3,214,679 | 10/1965 | Richards | 323/44 |
| 3,275,843 | 9/1966 | Meyerhoff | 307/88.5 |
| 3,327,273 | 6/1967 | Lee, III | 338/32 |
| 3,512,017 | 5/1970 | Pierce et al. | 307/306 |

Primary Examiner—Theodore M. Blum
Attorney, Agent, or Firm—Seidel, Gonda, Lavorgna & Monaco

[57] ABSTRACT

A superconducting non-linear device comprising a superconducting conductor, a current source associated with the conductor for applying to the conductor a bias current, and a control device associated with the current source for selectably controlling the magnitude of the bias current. The non-linear device according to the invention may be used in a number of circuit configurations, including current limiting, switching, mixing and detecting circuits.

2 Claims, 5 Drawing Sheets

SUPERCONDUCTING NON-LINEAR DEVICE

This is a divisional of copending application Ser. No. 07/735,132 filed on Jul. 24, 1991, which is a continuation-in-part of application serial number 07/671,589 filed Mar. 19, 1991, and assigned to the same assignee as the present application.

Field of the Invention

The present invention pertains to the field of superconducting circuit devices that exhibit non-linear operating characteristics which make them applicable to switching and other uses such as current limiting, mixing, detecting and modulating ac signals, for example.

Background of the Invention

Superconductivity is a phenomenon occurring at very low temperatures in many electrical conductors, in which the electrons responsible for conduction undergo a collective transition to an ordered state, of which superconductivity is a characteristic. This ordered state exhibits several unique and remarkable properties: disappearance of resistance to the flow of electric current, appearance of a large diamagnetism and other unusual magnetic effects, substantial alteration of many thermal properties, and the occurrence of quantum effects otherwise observable only at the atomic and subatomic level. The temperature below which a conductor begins to exhibit superconductivity is called the transition temperature or "critical temperature," usually designated $T_c$. Below the critical temperature, electrical resistance of low-temperature superconductors drops sharply to levels at least $10^{12}$ times less than at normal temperatures. In high-temperature superconductors in the microwave and millimeter wave regions, the resistance drops sharply to levels on the order of $10^3$ to $10^4$ times less than at normal temperatures.

Other phenomena beside the disappearance of electrical resistance are displayed by superconductors. One of these is the Meissner-Ochsenfeld effect, in which an applied magnetic field is excluded from the interior of the superconductor. As long as the magnetic flux in a superconductor is low, the superconductor will remain completely superconducting in an applied magnetic field. If the magnetic field becomes too large, however, the superconductor will become partially or totally normal. That is, when the magnetic field exceeds a "critical field," designated $H_{c1}$, the superconductor gradually reverts to the normal state and its resistance to electric current rises sharply.

Related to the Meissner-Ochsenfeld effect is the phenomenon of effective penetration depth. The way in which a superconductor excludes from its interior an applied magnetic field smaller than the critical field $H_{c1}$ is by establishing a persistent supercurrent on its surface and inside the material to the effective penetration depth which exactly cancels the applied field inside the superconductor. This current effectively flows in a very thin layer of thickness $\lambda$, which is called the effective penetration depth. The external magnetic field also penetrates the superconductor within the penetration depth. Lambda depends on the material and on the temperature, and is typically very small, on the order of 2000 to 5000 Angstroms.

The existence of the critical field leads to another property of superconductors which is of importance. A supercurrent flowing in a superconductor will itself create a magnetic field, and this field will drive the superconductor normal at some critical value of the current, called the critical current density, designated $J_c$. When the current in the superconductor exceeds the critical current density, the superconductor becomes normal and its resistance increases sharply.

These phenomena of superconductors can be put to practical applications. For example, a superconductor can be used as a switching device if it can be driven from the normal to the superconducting state and back again as desired. One way to change the state of a superconductor from superconducting to normal is to change the critical field. This approach is disclosed in U.S. Pat. No. 3,327,273, which discloses a gate element composed of a thin-film superconductor whose resistance is controlled by the application of an external magnetic field. By controlling the external magnetic field, the gate element can be driven from the superconducting to the normal state, and vice-versa.

These phenomena have also been exploited to create a variable resistance superconducting device, as shown in U.S. Pat. No. 2,978,664. This patent shows a tapered conductor of superconducting material which operates partially in the superconducting state and partially in the normal state. By tapering the conductor, there will eventually be a point at which the current density through it exceeds the critical current density, at which point the conductor becomes normal. By locating tap points along the tapered length of the conductor, different resistance behaviors can be obtained.

The present invention differs from the approaches shown in these patents in that the invention does not require any complex geometries or associated field generating apparatus such as coils and windings. The present invention provides a simple superconducting non-linear device that can be used for switching, limiting, mixing, detecting and other applications.

Summary of the Invention

The present invention is a superconducting non-linear device comprising a superconducting conductor means, current source means associated with the conductor means for applying to the conductor means a bias current, and control means associated with the current source means for selectably controlling the magnitude of the bias current.

Description of the Drawings

For the purpose of illustrating the invention, there is shown in the drawings a form which is presently preferred; it being understood, however, that this invention is not limited to the precise arrangements and instrumentalities shown.

Description of the Invention

Figure 1A:
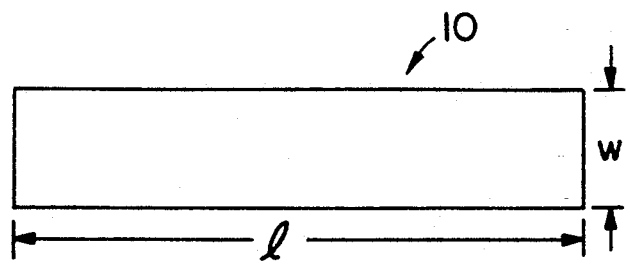
FIGS. 1a and 1b illustrate a superconducting conductor of length l, constant width w and thickness d.
Figure 1B:
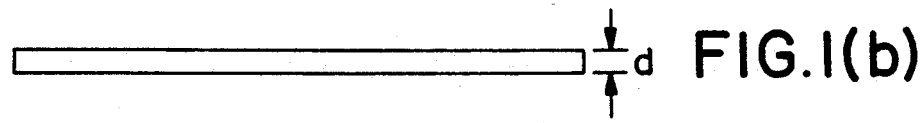

Referring now to the drawings, there is shown in FIG. 1 a typical superconductor 10. FIG. 1(a) is a top plan view, and FIG. 1(b) is a side elevation view thereof. Superconductor 10 may be thought of as a thin-film superconductor having a length l, a width w and a thickness t. Length l and width w are arbitrary, and thickness t may be as much as 5000 to 6000 Å. Width w and thickness t are assumed to be constant along the length l of superconductor 10. Hence, the resistance of superconductor 10 is constant everywhere along length l. Preferably, although not necessarily, in the superconducting region the dimensions of superconductor 10 are chosen so that the desired current is less than the maximum current $I_{max}$ defined below.

The current density in a superconductor in the superconducting region varies exponentially as follows:

$$J(d) = J_c e^{-d/d_p} \quad (1)$$

where:

$J_c$ is the critical current density measured at the surface of the thin film;

d is the thickness of the thin film; and $d_p$ is the so-called depth of penetration.

The maximum current in the superconducting region is given by:

$$I_{max} = J_c w d_p (1 - e^{-d/d_p}) \quad (2)$$

where:

$I_{max}$ is the maximum current; and
w is the width of the strip.

If the strip is very thick compared to $d_p$, i.e., $d \gg d_p$, then equation (2) becomes in the limit:

$$I_{max} \rightarrow J_c w d_p \quad (3)$$

The lowest critical magnetic field $H_{c1}$ above which there is a transition region can be expressed as:

$$H_{c1} = \frac{I_m}{2(w + d)} \quad (4)$$

The relationship between $H_{c1}$, $J_c$ and $d_p$ can be expressed as:

$$\alpha = \frac{2H_{c1}}{J_c d_p} \quad (5)$$

In some applications, it is desirable to find the condition that results in a minimum current $I_{min}$ which generates a magnetic field that exceeds the critical magnetic field $H_{c1}$. This condition is important for switches, limiters (low power), and non-linear devices (i.e., mixers and video detectors).

For $\alpha \leq 1$, the optimum thickness $d_o$ cannot be found in a closed mathematical form. It is obtained by solving the following equation:

$$\alpha + \alpha \left( \frac{d_o}{d_p} - 1 \right) e^{-d_o/d_p} - (1 - e^{-d_o/d_p})^2 = 0 \quad (9)$$

The optimum width becomes:

$$w_o = \frac{I_{min}}{J_c d_p (1 - e^{-d_o/d_p})} \quad (10)$$

Figure 2:
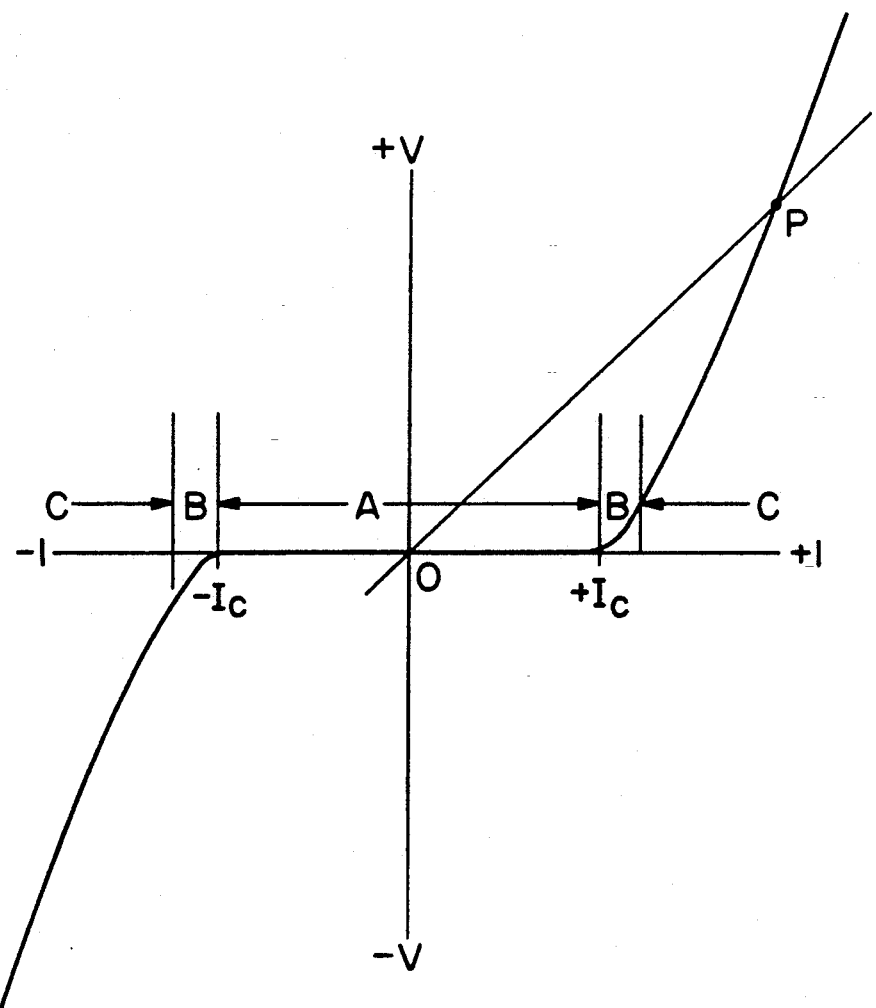
FIG. 2 is a graph of voltage drop across the superconductor as a function of current for a typical superconductor in the temperature region below $T_c$.

A typical voltage-current characteristic for a thin-film superconductor of a given cross-sectional area is illustrated in FIG. 2. The curve in FIG. 2 is a graph of the voltage (V) across the superconductor as a function of the current (I) through it. Those skilled in the art will understand that the resistance of the superconductor can be determined from Ohm's law as the ratio of V/I. Hence, the incremental slope, dV/dI, of the curve in FIG. 2 represents the resistance of the superconductor at a given point on the curve. As seen in FIG. 2, the superconductor has a superconducting region A of substantially zero slope, and therefore zero resistance, for values of current below the critical current $I_c$. Critical current $I_c$ is a function of effective critical current density $J_c$ and the cross-sectional area of the superconductor, as will be understood by those skilled in the art. Once current begins to exceed $I_c$, the superconductor ceases to superconduct, and its resistance begins to rise. The curve in FIG. 2 has a transition region B in which the incremental slope, and therefore the incremental resistance of the superconductor, begins to rise and a conduction, or "normal" region C in which the incremental slope, and therefore the incremental resistance of the superconductor, is appreciably greater than the resistance of superconducting region A. In region C, the curve can in some cases be idealized to a linear relationship between incremental voltage dV and incremental current dI.

Figure 3:
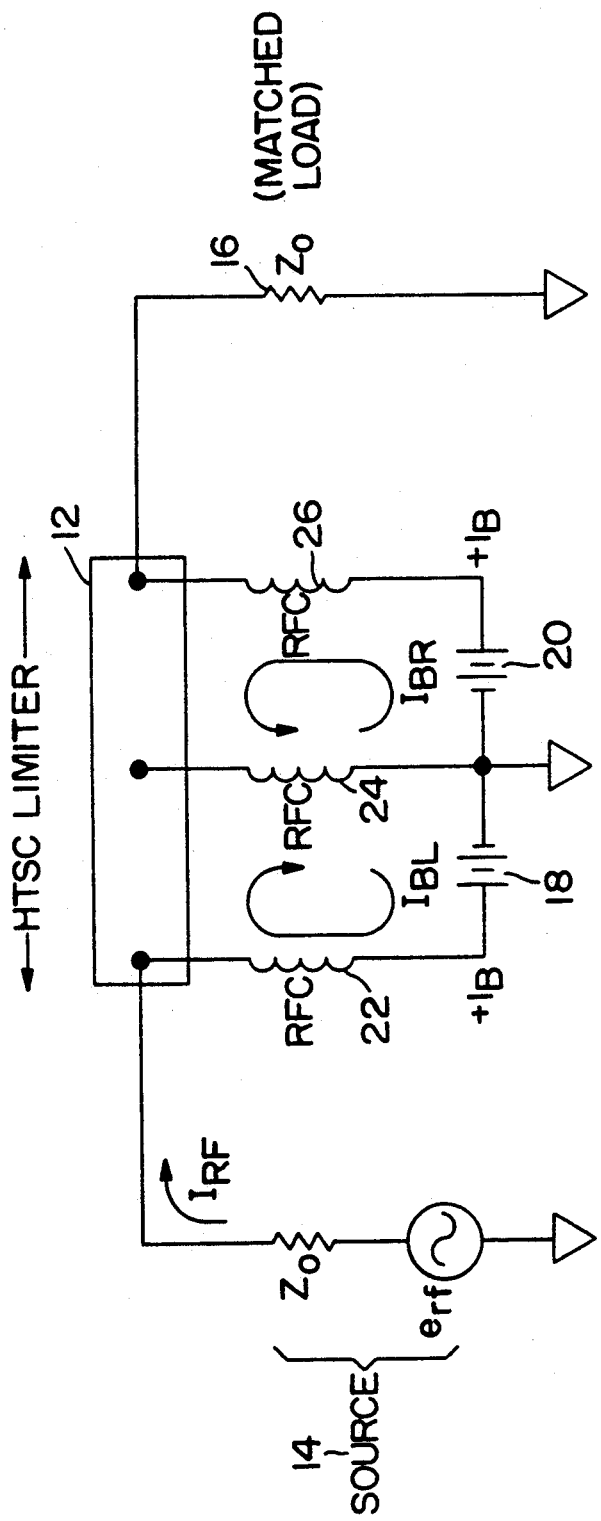
FIG. 3 is a simplified diagram of a limiting or switching device according to one embodiment of the invention.

The resistance characteristic shown in FIG. 2 makes it possible to use a thin-film superconductor such as superconductor 10 as a balanced limiter. Referring now to to FIG. 3, there is shown a superconducting element 12 in series between a signal source 14 and a load 16. Source 14 is connected to one end of superconductor 12, which may be thought of as the input end, and load 16 is connected to the other end, which may be thought of as the output end. Source 14 is contemplated to be a source of RF current $I_{RF}$, but any signal may be generated by source 14 without departing from the invention.

Also connected to superconductor 12 are sources 18 and 20 of DC bias current. DC source 18 is connected to the superconductor 12 at the input end and at the center, and is preferably connected through series RF chokes 22 and 24. RF chokes are used to prevent RF signals from source 14 from coupling to DC source 18 and through to ground. In similar fashion, DC source 20 ia connected to the superconductor 12 at the output end and at the center, and is also preferably connected through series RF chokes 24 and 26. The respective polarities of DC sources 18 and 20 are chosen to cause DC bias currents to flow in the superconductor 12 in the directions shown by arrows $I_{BL}$ and $I_{BR}$ in FIG. 3. The magnitudes of currents $I_{BL}$ and $I_{BR}$ are preferably equal, so that limiting will be "balanced." As those skilled in the art will understand, balanced limiting will be symmetrical and will yield no undesirable DC or even harmonic components.

Figure 4:
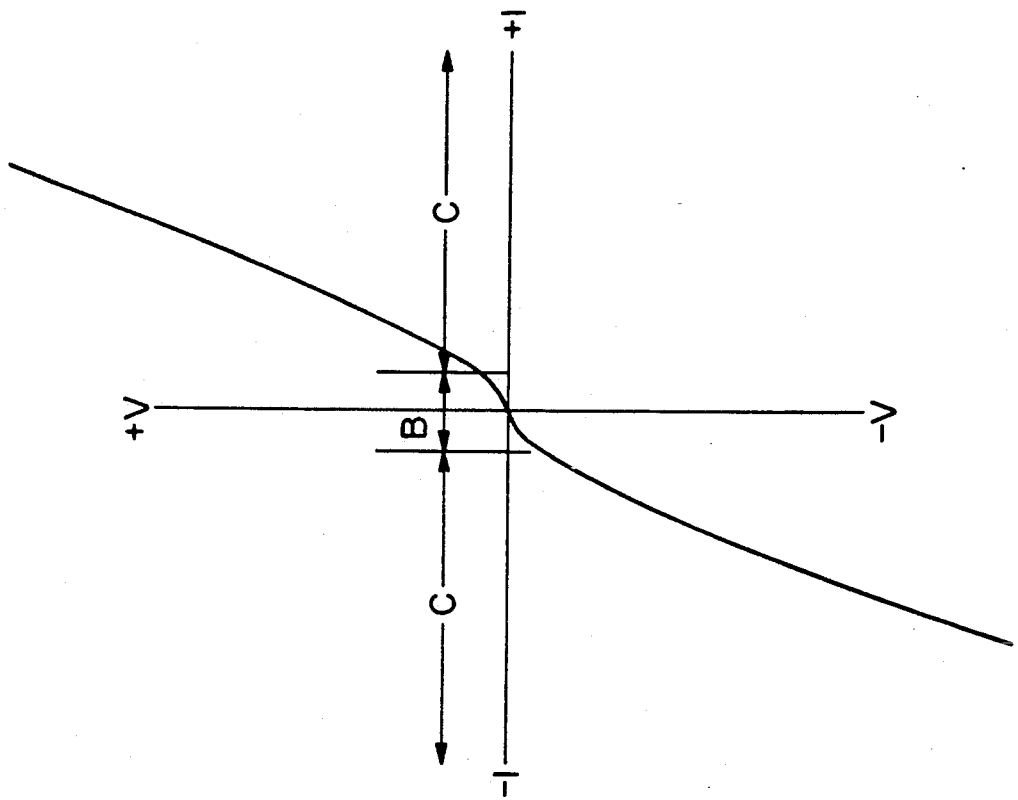
FIG. 4 is a graph of voltage vs. current with a reduced superconducting region due to the presence of a bias current.

When currents $I_{BL}$ and $I_{BR}$ are caused to flow as shown in FIG. 3, the effect on the superconductor 12 is to reduce the superconducting region, as illustrated in FIG. 4. As comparison with FIG. 2 shows, the superconducting region A in FIG. 4 is much narrower, which means that when the total current in superconductor 12, peak $I_{RF}$ plus the bias current, exceeds the critical current the superconductor will be driven into regions B and C, where resistance will increase rapidly and limiting will occur. When the total current exceeds peak $I_{RF}$ plus $I_{BL}$, limiting will occur on the negative half-cycle of $I_{RF}$. When the total current exceeds peak $I_{RF}$ plus $I_{BR}$, limiting will occur on the positive half-cycle of $I_{RF}$.

In many applications, zero bias current can be used. With zero bias, region A of FIG. 4 is maximized and balanced limiting occurs automatically. In addition, increasing the bias current can eliminate region A entirely. Thus, by varying the DC bias current, operation of the limiter can be current controlled.

For special applications, the limiter can be unbalanced by making the magnitudes of $I_{BL}$ and $I_{BR}$ different. Thus, it is possible to operate the limiter so that only the positive half-cycles or only the negative half-cycles of the RF current are limited, or so that the positive and negative half-cycles are limited to different degrees.

Figure 5:
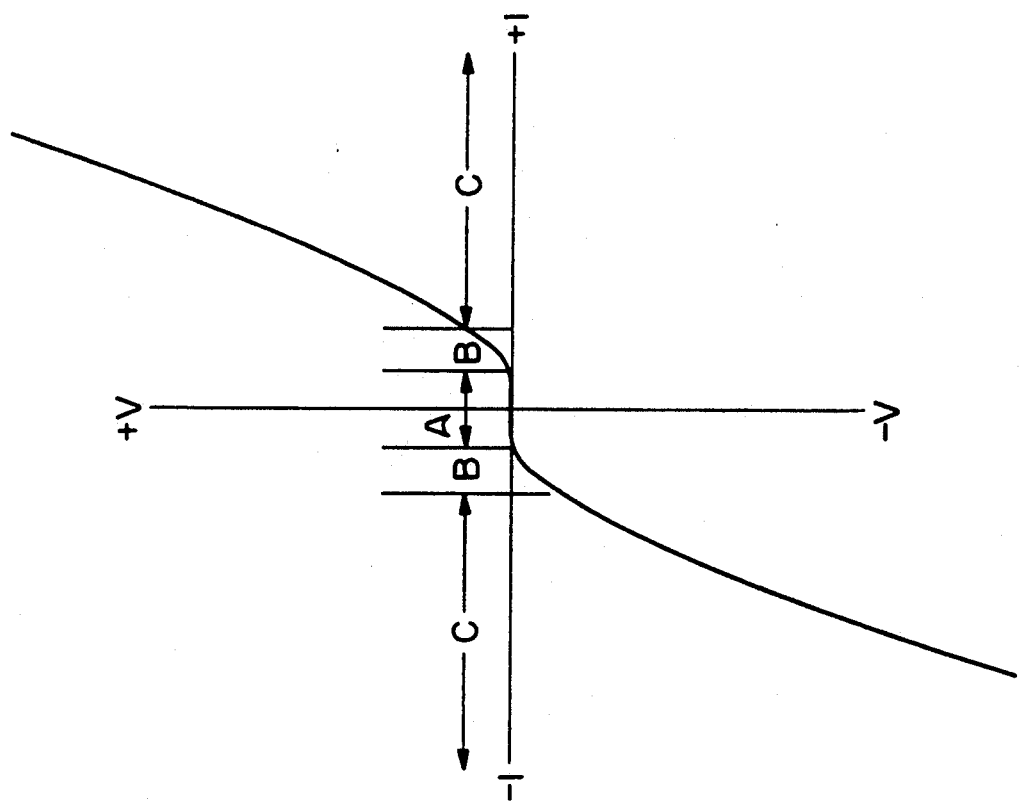
FIG. 5 is a graph of voltage vs. current with substantially no superconducting region due to the presence of a bias current, and which illustrates the switching behavior of the superconductor.

Superconductor 12 can also be made to operate as a switch by turning the bias current off and on between zero and a value in excess of the critical current. By controlling the amplitude of the bias current between zero and a value greater than $I_c$, the superconductor can be operated in either its superconducting state or its normal state. That is, for zero bias currents, $I_B=0$, the superconductor will operate in region A as shown in FIG. 2, and will remain superconducting as long as the amplitude of the RF signal is less than the critical current. Under these conditions, the superconductor has effectively zero resistance and appears as a closed switch to a signal applied to it. For bias currents above the critical current, that is, for $I_B>I_c$, the superconductor will be biased to operated in conduction regions B and C, and will exhibit a high resistance. Thus, the superconductor will appear as an open switch to a signal applied to it, and will operate as illustrated in FIG. 5, so long as the applied signal does not reduce the current below the critical current $I_c$.

In short, superconductor 12 can be made to act as both a limiting and a switching device simply by controlling the DC bias current through it. This permits the construction of a simple and easy to operate superconducting switching element using only a minimum number of parts and which can be conveniently fabricated using conventional fabrication methods.

A thin-film superconductor as shown in FIG. 1 can be made to operate as a mixer, such as typically used in superheterodyne and other receivers. A common form of mixer in the art is the diode ring mixer, which employs a diode bridge in which the diodes act as switches controlled by the local oscillator signal. As those skilled in the art will know, during the positive half-cycle of the local oscillator (LO) signal, the RF input will be connected to the intermediate frequency (IF) output. During the negative LO half-cycle, the RF is again connected to the IF output, but with its polarity reversed. The RF is down-converted, in well-known manner, to IF. This type of mixing circuit is often referred to as a doubly balanced mixer.

As inspection of FIG. 2 shows, the characteristic V-I curve for a typical superconductor resembles the V-I curve for a pair of back-to-back semiconductor diodes or a diode bridge. Thus, if the superconductor is biased to region B, for negative swings of an RF current the superconductor will be operating in region A and for positive swings the superconductor will be operating in regions B and C.

Figure 6:
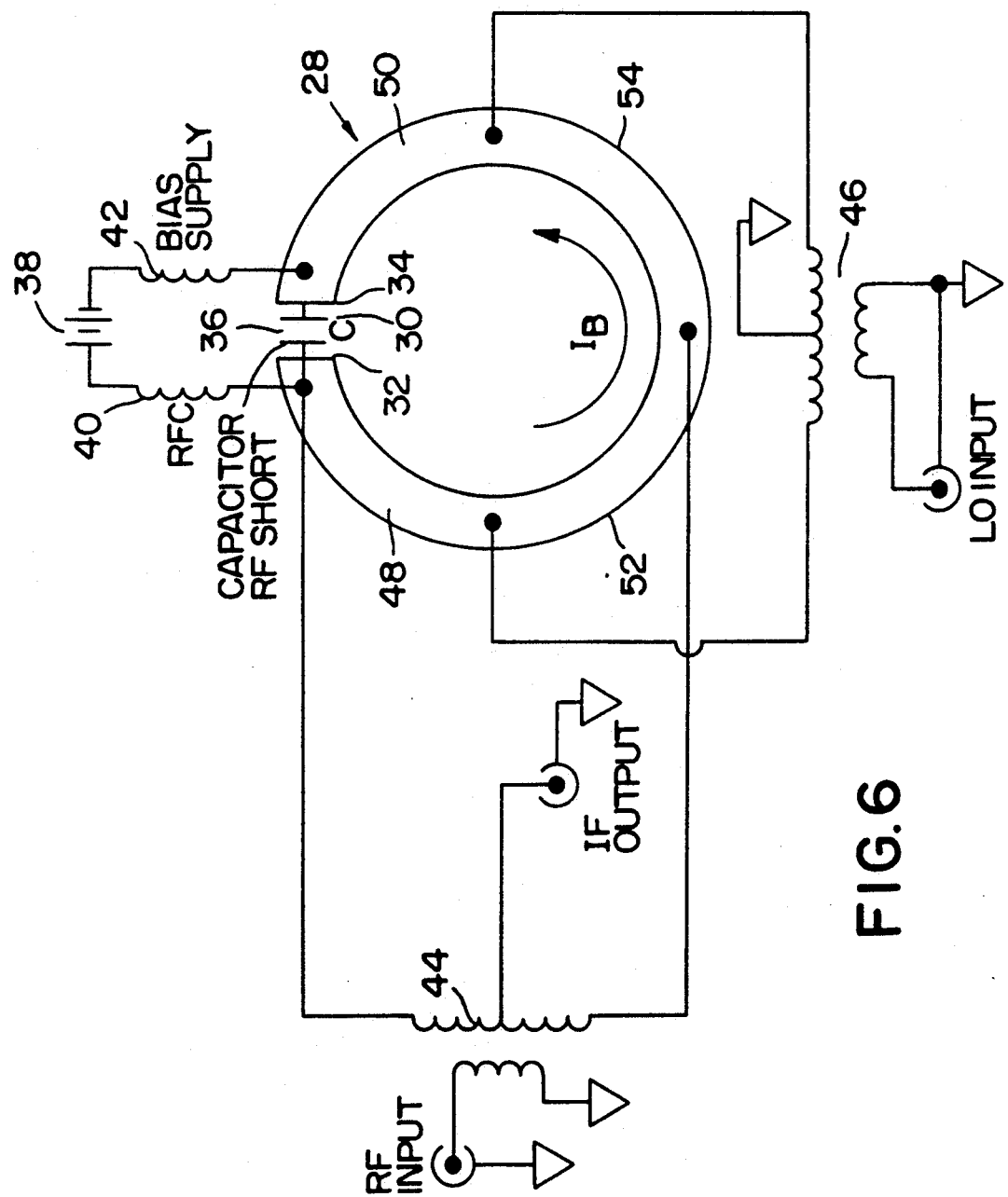
FIG. 6 is a simplified diagram of a ring mixer using a superconducting element instead of a conventional diode bridge.

One way in which a superconductor can be configured to act as a ring mixer is shown in FIG. 6. A superconducting element 28 in the form of an open circle. Thus, there is a narrow gap 30 between respective ends 32 and 34 of circle 28. The gap creates an open circuit to DC but is narrow enough to appear as a short circuit at RF frequencies. Hence, the is capacitive coupling of RF signals across the gap, as represented by capacitor 36. A DC source 38 is connected across gap 30 through series connected RF chokes 40 and 42. DC source 38 is adjusted to supply a bias current $I_B$ sufficient to bias superconductor 28 to a point in region B of its characteristic V-I curve. RF input to the superconductor is applied across diametrically opposite points on superconductor 28, with one point being adjacent gap 30. RF is coupled to superconductor 28 via a transformer 44, in the same manner as in a conventional ring mixer. The LO input is applied to the superconductor 28 across diametrically opposite points, which are rotated 90 degrees with respect to the RF input points. As with the RF input, the LO input is coupled to the superconductor 28 through a second transformer 46 in known manner. The IF output is taken from the center of the secondary of transformer 44, again in known manner.

The bias current $I_B$ will maintain the superconductor 28 in region B of its operating characteristic. Then, when the polarity of the LO voltage is such that the right-hand side (as viewed in FIG. 6) of the secondary of transformer 46 is positive, segments 52 and 54 of superconductor 28 will be operating in region C, and will exhibit high resistance. At the same time, segments 48 and 50 will be operating in region A, and will appear as short circuits. When the LO polarity reverses, segments 48 and 50 will be operating in high-resistance region C and segments 52 and 54 will appear as short circuits. Superconductor 28 thus acts as a polarity reversing switch, in the same manner as a diode ring mixer.

A thin-film superconductor as shown in FIG. 1 can also be made to operate as a square-law device by biasing the superconductor to operate in region B where the voltage-current characteristic of a thin-film semiconductor exhibits approximately quadratic behavior. That is, the voltage and current about the bias point, taking into account both the DC bias and the rf signal to be detected, are approximately related as $$i_T = I_B + k_1 v + k_2 v^2$$

where $i_T$ is the total current due to both dc bias and rf signal, $I_B$ is the DC bias current, v is the rf and detected voltage around the bias point, and $k_1$ and $k_2$ are constants for the superconductor at the bias point. This equation represents the familiar expansion series about the bias point. The quadratic term $k_2 v^2$ represents the quadratic behavior which makes detection possible. For simplicity, higher order terms in the series are ignored as negligible. By biasing the superconductor to operate in region B, the superconductor will behave as a square-law device for input signals of small current amplitudes.

This behavior permits the superconductor to be used as a square-law detector, mixer, frequency converter and the like.

Figure 7:
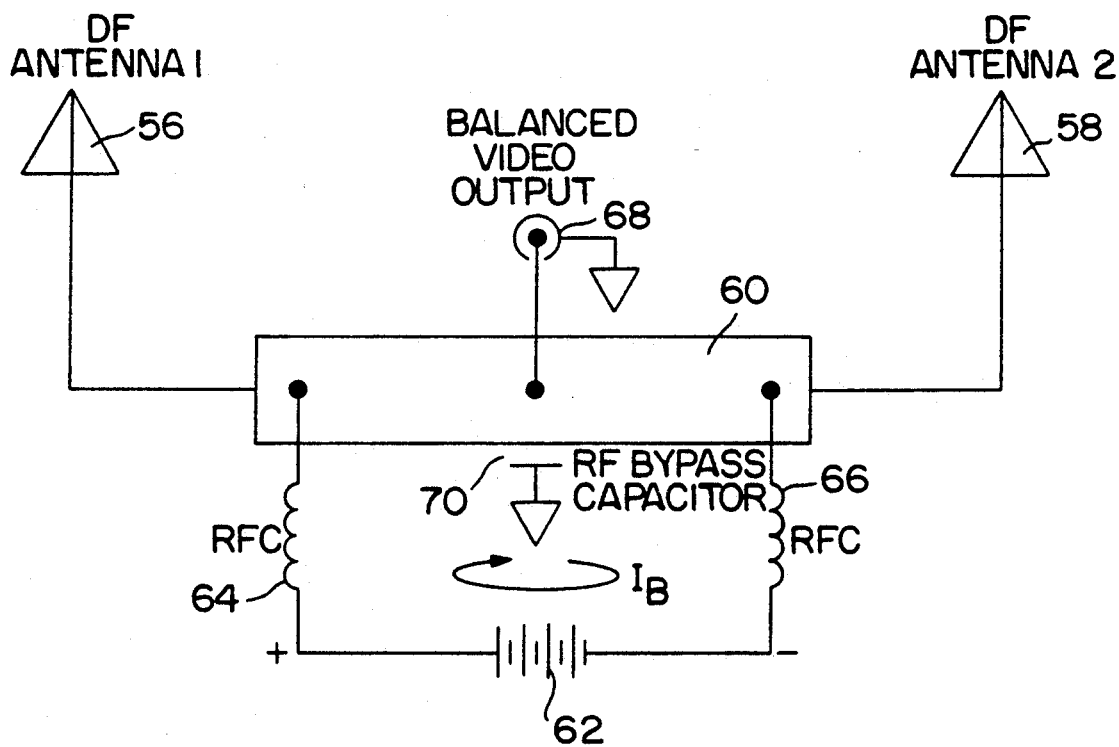
FIG. 7 is a simplified diagram of a balanced video detector according to one embodiment of the invention.

A balanced detector circuit employing a superconductor biased to its quadratic operating region is schematically illustrated in FIG. 7. The detector circuit comprises a pair of antennas 56 and 58 which receive signals to be detected, such as modulated RF signals. Antennas 56 and 58 may be any type of antenna suitable for the signals to be detected. The outputs of antennas 56 and 58 are applied to respective ends of a square-law detector device in the form of a thin-film superconductor 60. Superconductor 60 is biased to an operating point in its quadratic operating region, region B, by a DC bias current supplied from a DC source 62 through a RF chokes 64 and 66. (It is assumed that the input circuit of amplifier 50, discussed below, provides a return to ground for the DC bias current.) As described above, RF chokes 64 and 66 present substantially no DC resistance to the bias current, but present a high impedance to the RF, so that RF energy is not coupled to the DC source or shunted around the superconductor 60. An output 68 of balanced video is taken from the center of superconductor 60, substantially midway between the respective ends to which the antennas 56 and 58 are connected. An RF bypass capacitor 70 is provided between the superconductor 60 and electrical ground.

By properly choosing the bias current, and hence the operating point, of superconductor 60, it will behave as a pair of head-to-head square-law diodes. As a result, the video output from the left-hand side of superconductor 60 will be negative and the video output from the right-hand side will be positive. If the input signals from antennas 56 and 58 are equal, the video outputs from the left-hand and right-hand sides of superconductor 60 will be of opposite polarity but of equal magnitude, and thus the balanced video output 70 will be zero. An imbalance between the two input signals from the antenna 56 and 58 will result in either a positive or negative balanced video output signal. Thus, the arrangement of FIG. 7 can be used as a conventional direction finding circuit.

Referring now back to FIG. 2, in regions B and C of the curve there is a DC resistance associated with any point on the curve. The DC resistance is the slope of a line drawn from the origin 0 to that point, for example point P. At that point, the superconductor will have a DC voltage V across it and a DC current I through it, and thus the superconductor will dissipate power equal to the product of V and I. In addition, at any given point on the curve, such as point P, there is an incremental resistance, as noted above, which is the slope of a line tangent to the curve at that point. (Point P is shown for ease of illustration as being in region C of the curve, but it should be understood that point P may be, and in some cases is preferred to be, in region B.) If a time-varying signal, such as an RF signal, is applied to a superconductor biased to point P, the incremental resistance will vary with the instantaneous values of V and I as they vary with the applied signal. If the applied signal is small enough, the curve may be considered a straight line, i.e., the incremental resistance dV/dI is equal to a constant. As a result of the applied signal, the superconductor will also dissipate power equal to the product of the square of the current and the incremental resistance in this "straight line" region of the curve. In those cases where the curve cannot be considered a straight line, it is necessary to resort to integration and averaging techniques to determine signal power dissipation. However, by minimizing the bias current, it is possible to minimize the total power dissipated by the superconductor, and therefore to minimize unwanted heating of the superconductor.

In all of the foregoing embodiments of the invention, a control means such as a variable resistor or potentiometer, may be placed in series with the DC bias current source to control the magnitude of the DC bias current applied to the superconducting element. Thus, the magnitude of the DC bias current can be controlled from zero to any desired value, depending upon the particular application to which the superconducting element is to be put. If desired, means other than a simple variable resistor or potentiometer, such as a solid-state switching circuit, can be used to control the magnitude of the DC bias current. As already described, controlling the magnitude of the DC bias current enables the superconducting element to be used as a switch, a limiter, a mixer, a modulator and a detector, among other uses, as desired.

The present invention may be embodied in other specific forms without departing from the spirit or essential attributes thereof and, accordingly, reference should be made to the appended claims, rather than to the foregoing specification, as indicating the scope of the invention.

I claim:

1. A balanced video detecting device, comprising a detecting element in the form of a superconducting film, the film having a first end, a second end, and a center, means for inputting a signal to be detected from a first antenna to the first end and means for inputting the signal to be detected from a second antenna to the second end, means for applying a DC bias current to said detecting element for causing the DC bias current to flow unidirectionally between the first and second ends, and means approximately at the center of the film for obtaining a balanced video output.

2. A balanced video detecting device according to claim 1, wherein the thickness $d_o$ and width $w_o$ of the film satisfy the following equations:

$$\alpha + \alpha \left( \frac{d_o}{d_p} - 1 \right) e^{-d_o/d_p} - (1 - e^{-d_o/d_p})^2 = 0$$

and $$w_o = \frac{I_{min}}{J_c d_p (1 - e^{-d_o/d_p})}$$

* * * * *